United States Patent
Pyo et al.

(10) Patent No.: US 10,486,191 B2
(45) Date of Patent: Nov. 26, 2019

(54) APPARATUS FOR EVALUATION OF DEPOSITION PROCESS IN MANUFACTURING OF ORGANIC THIN FILM

(71) Applicants: SFC CO., LTD., Cheongju-si (KR); Samsung Display Co., Ltd., Yongin-si (KR)

(72) Inventors: Sung-Wan Pyo, Daejeon (KR); Oun-Gyu Lee, Cheongju-si (KR); Young-Hwan Park, Cheongju-si (KR); Myeong-Suk Kim, Yongin-si (KR); Soung Wook Kim, Yongin-si (KR)

(73) Assignees: SFC CO., LTD., Cheongju-si (KR); SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/687,442

(22) Filed: Aug. 26, 2017

(65) Prior Publication Data

US 2018/0056326 A1    Mar. 1, 2018

(30) Foreign Application Priority Data

Aug. 29, 2016  (KR) .......................... 10-2016-0109881

(51) Int. Cl.
| | | |
|---|---|---|
| *C23C 16/00* | (2006.01) | |
| *B05D 1/00* | (2006.01) | |
| *C23C 14/12* | (2006.01) | |
| *C23C 14/56* | (2006.01) | |
| *H01L 51/00* | (2006.01) | |

(52) U.S. Cl.
CPC ................ *B05D 1/60* (2013.01); *C23C 14/12* (2013.01); *C23C 14/564* (2013.01); *H01L 51/0031* (2013.01)

(58) Field of Classification Search
CPC ...... C23C 14/24; C23C 14/562; C23C 16/545
USPC ................................................... 118/726, 727
See application file for complete search history.

(56) References Cited

U.S. PATENT DOCUMENTS

| | | | | |
|---|---|---|---|---|
| 4,233,937 A | * | 11/1980 | Steube .................... | C23C 14/24 118/50.1 |
| 4,403,002 A | * | 9/1983 | Akashi ................... | C23C 14/562 118/718 |
| 4,519,339 A | * | 5/1985 | Izu ......................... | C23C 16/517 118/718 |
| 9,368,772 B1 | * | 6/2016 | Chen ..................... | H01M 2/1094 |
| 2011/0092010 A1 | * | 4/2011 | Van Duren ............ | B22F 1/0055 438/62 |
| 2011/0143019 A1 | * | 6/2011 | Mosso ................ | C23C 16/0209 427/58 |
| 2011/0281106 A1 | * | 11/2011 | Kishimoto ............... | C08J 7/045 428/328 |

(Continued)

FOREIGN PATENT DOCUMENTS

| | | |
|---|---|---|
| KR | 1020080062168 A | 7/2008 |
| KR | 1020140102090 A | 8/2014 |

*Primary Examiner* — Keath T Chen
(74) *Attorney, Agent, or Firm* — STIP Law Group, LLC

(57) ABSTRACT

Disclosed is an apparatus for evaluation of a deposition process in organic thin film-manufacturing processes using a chamber employing a deposition-preventing plate, by which it can be predicted whether a thin film layer formed on the deposition-preventing plate will be delaminated. Also provided is a method for evaluating a deposition process of an organic material, using the apparatus.

8 Claims, 5 Drawing Sheets

(56) References Cited

U.S. PATENT DOCUMENTS

2012/0021126 A1* 1/2012 Theoden ............... C23C 14/243
　　　　　　　　　　　　　　　　　　　　427/248.1
2012/0021128 A1* 1/2012 Dickey ............. C23C 16/45551
　　　　　　　　　　　　　　　　　　　　427/255.28

* cited by examiner

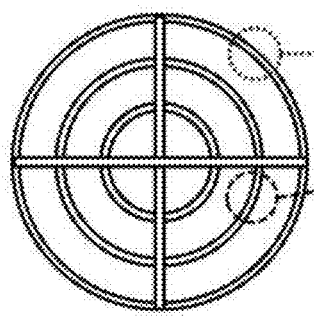
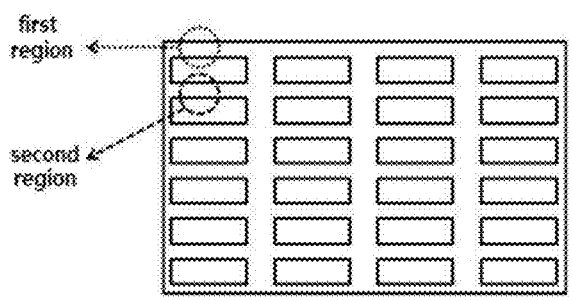
FIG. 2a    FIG. 2b
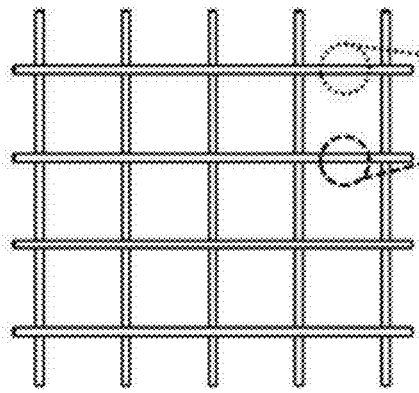
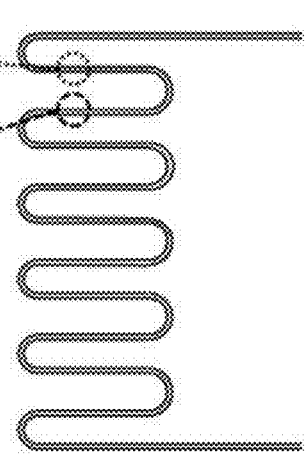
FIG. 2c    FIG. 2d
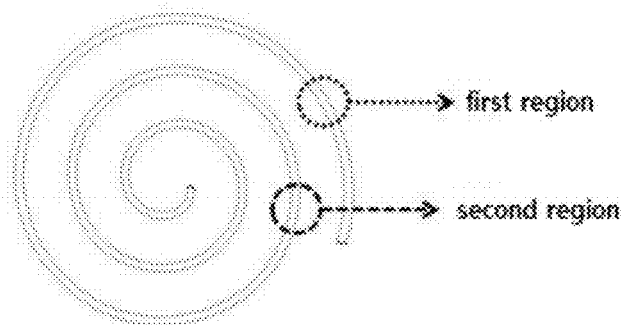
FIG. 2e

APPARATUS FOR EVALUATION OF DEPOSITION PROCESS IN MANUFACTURING OF ORGANIC THIN FILM

CROSS-REFERENCE TO RELATED APPLICATIONS

This application claims the priority of the Korean Patent Applications NO 10-2016-0109881 filed on Aug. 29, 2016, in the Korean Intellectual Property Office, the disclosure of which is incorporated herein by reference.

BACKGROUND OF THE DISCLOSURE

1. Field of the Disclosure

The present disclosure relates to an apparatus for evaluation of a deposition process in the manufacture of an organic thin film and, more particularly, to an apparatus for evaluation of a deposition process in organic thin film-manufacturing processes using a chamber employing a deposition-preventing plate, by which it can be predicted whether a thin film layer formed on the deposition-preventing plate will be delaminated. Also, the present disclosure concerns a method for evaluating a deposition process of an organic material, using the apparatus.

2. Description of the Prior Art

Vacuum deposition accounts mainly for the deposition processes by which thin films including organics or metal organic compounds are formed on a substrate for use in the manufacture of display panels or organic semiconductors.

In vacuum deposition, a material to be formed into a thin film in a vacuum is purified to have a high purity and vaporized by a physical process such as heating when it is in a liquid state, followed by solidification on the surface of a substrate of interest to form a thin film. When it is a solid state, the material is liquefied and then vaporized, or sublimated before solidification into a thin film.

Such vacuum deposition processes may be applied to almost all kinds of substrates. Since vacuum deposition operates at pressures well below atmospheric pressure, air is evacuated from the inside of a chamber. Subsequently, a material to be deposited is stored in a reservoir such as a crucible, vaporized by heating, and deposited to form a thin film on the substrate.

In this regard, the compound to be deposited, which is an organic or an organometallic compound, may be deposited on other regions in the chamber as well as the desired target substrate. After completion of the processes, the material attached to the inside wall of the chamber or clinging to other parts in the chamber may degrade the durability of the facility. Therefore, there is a need for eliminating the used material which acts as a contaminant to the inside and internal parts of the chamber.

In order to prevent the deposition of a material of interest on undesirable regions, such as surfaces of the chambers, a deposition-preventing plate may be arranged at a suitable space inside the chamber. Further, the deposition-preventing plate may be exchanged with a fresh one after a predetermined number of rounds of deposition so as to improve the durability of the chamber while lowering contamination in the chamber.

In such conventional deposition apparatuses, a deposition-preventing plate is arranged on an inside wall or an internal part of the chamber to allow an object material to pile up thereon and once the object material has piled up to some degree, the deposition restarts after the deposition-preventing plate is exchanged with a fresh one.

For fabrication methods of, for example, organic light-emitting diodes, frequent exchanges of such deposition-preventing plates cause inconvenience and require additional working time for processes, incurring economical and temporal losses. Hence, it is advantageous for various aspects including economy to maintain deposition-preventing plates in the chamber as long as possible and to increase a number of rounds of deposition while the deposition-preventing plates are retained.

In this regard, however, the deposition-preventing plates in the chamber used for deposition processes over an extended period of time may have a thin film layer thereon which is much thicker than that formed on the target substrate according to kinds of compounds to be deposited and process conditions.

For instance, a thin film may be formed to several millimeters on a deposition-preventing plate in a chamber after 1,000 rounds of deposition with a deposition material. In this case, all or part of the thin film formed on the deposition-preventing plate may be delaminated or descaled, which may be a factor in generating particles during the deposition processes, with the consequence change of properties in the thin film element.

Such a thin film-depositing apparatus having a deposition-preventing plate is found in Korean Patent No. 10-2014-0102090 A (Aug. 21, 2014), which discloses a thin film deposition device having a deposition-preventing unit in which a thin film formed on the deposition-preventing unit can easily be removed during deposition, and a method for removing deposits thereof. However, none of conventional techniques including the above-mentioned related art state an apparatus for evaluating in advance or predicting the plausibility that a thick thin film layer formed on a deposition-preventing plate could be delaminated or descaled after many rounds of deposition, as described above, according to kinds of object materials and process conditions, nor a method of evaluating deposition processes using the same. However, there is a high degree of technical needs for such apparatuses and methods.

RELATED ART DOCUMENT

Patent Document (Patent document 1) Korean Patent Publication No. 10-2014-0102090 A (Aug. 21, 2014)

SUMMARY OF THE DISCLOSURE

The present disclosure has been made in order to solve the above-mentioned problems in the related art and an aspect of the present disclosure is to provide an apparatus for evaluating a deposition process, which is structured to evaluate in advance or predict the formation of a thick thin film layer on a deposition-preventing plate during a long period use of deposition in a chamber, whereby all or part of the thin film layer can be prevented from being delaminated or descaled.

Another aspect of the present disclosure is to provide a method for evaluating a deposition process in which the apparatus for evaluating a deposition process is used to evaluate in advance whether or not deposition with a compound to be deposited can be attached for a long period of time in a chamber equipped with a deposition-protecting plate upon the manufacture of an organic thin film.

According to an aspect thereof, the present disclosure provides an apparatus for evaluating a deposition process in the manufacture of an organic thin film, comprising a chamber in which a process of depositing an organic thin film is performed; a vaporization source, provided inside the chamber, for vaporizing an object compound by heating; and a means for evaluating deposition modality in which the compound vaporized by heating is solidified into a solid phase, followed by analyzing the surficial morphology of the solidified compound.

In the present disclosure, the vaporization source may comprise a reservoir containing the compound to be deposited; and a heating part for heating the reservoir to vaporize the compound to be deposited, and in this regard, the reservoir may be in a form of a crucible or a boat.

In the present disclosure, the chamber may have an internal pressure lower than atmospheric pressure therein, and the means for evaluating deposition modality may be made of a material containing a metal, ceramic, or a combination thereof.

In the present disclosure, the means for evaluating deposition modality may comprise a first region on a part of which the compound to be deposited is solidified in a solid phase from a vapor state established by heating; and a second region on a part of which the compound which the compound to be deposited is solidified in a solid phase from a vapor state established by heating, the second region being distant from the first region with spatial separation therebetween. In this case, the first and the second region are each a part of a mesh structure made of wires or a part of a plate structure in which openings are formed.

In the means for evaluating deposition modality, comprising a first region on a part of which the compound to be deposited is solidified in a solid phase from a vapor state established by heating; and a second region on a part of which the compound which the compound to be deposited is solidified in a solid phase from a vapor state established by heating, the second region being distant from the first region with spatial separation therebetween, when the first region is extended, the first region may be connected to the second region, or may not be connected to the second region wherein the first and the second region may be connected to and supported by respective supports.

In the present disclosure, the first region and the second region may be separated from each other a distance of 1 to 10 mm.

According to another aspect thereof, the present disclosure provides a method for evaluating a deposition process to determine whether or not the deposition of a compound to be deposited into an organic thin film can be performed, wherein the compound to be deposited is introduced into the vaporization source of the aforementioned apparatus for evaluating a deposition process and solidified on at least part of the surface of the means for evaluating deposition modality by heating, followed by checking the deposition morphology of the compound on the means for evaluating deposition modality.

According to a further aspect thereof, the present disclosure provides a method for evaluating a deposition process, comprising the steps of: introducing a compound to be deposited into the vaporization source of the aforementioned apparatus for evaluating a deposition process and solidifying the compound on at least part of a surface of the means for evaluating deposition modality by heating; checking the deposition morphology of the compound solidified on the surface of the means for evaluating deposition modality; and determining whether or not to perform an organic thin film deposition process within a chamber containing a substrate to be deposited with the compound and a deposition-preventing plate, depending on surficial morphologies of the solidified compound.

In the present disclosure, the step of determining whether or not to perform an organic thin film deposition process is to make a decision on continuing to run the process depending on the degree of blockage of a space between the first and the second region of the means for evaluating deposition modality as the compound to be deposited is solidified on the first and the second region.

BRIEF DESCRIPTION OF THE DRAWINGS

The above and other aspects, features and advantages of the present disclosure will be more apparent from the following detailed description taken in conjunction with the accompanying drawings, in which:

FIG. 2a to FIG. 2e are schematic views illustrating at least parts of the means for evaluating deposition modality, which includes a first and a second region, according to one embodiment of the present disclosure;

DETAILED DESCRIPTION OF THE EXEMPLARY EMBODIMENTS

Figure 1A:
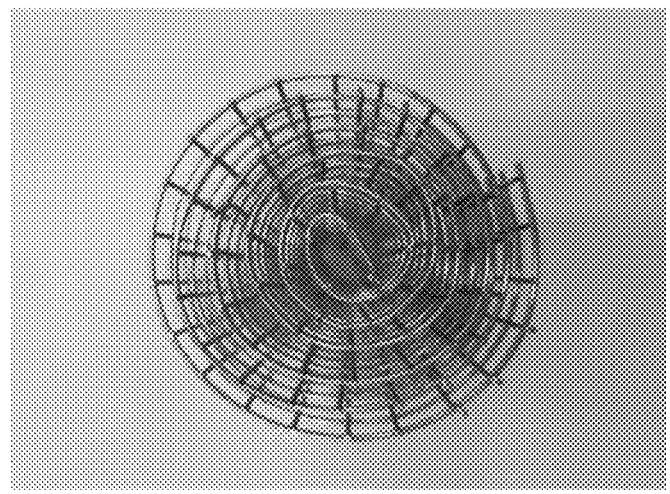
FIG. 1a and FIG. 1b are photographic images, taken from a top view point (FIG. 1a) and a side view point (FIG. 1b), showing a means for evaluating deposition modality, which has a mesh structure in accordance with one embodiment of the prevent disclosure.

Hereinafter, the apparatus for evaluation of a deposition process and the method for evaluation of a deposition process using the same in accordance with the present disclosure will be in detail described with reference to the accompanying drawings so that a person skilled in the art can easily implement exemplary embodiments of the present disclosure.

In each drawing of the present disclosure, sizes or scales of components may be enlarged or reduced from their actual sizes or scales for better illustration, and known components may not be depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

Therefore, the description proposed herein is merely a preferable example for the purpose of illustration only, and is not intended to limit the scope of the disclosure, so it should be understood that other equivalents and modifications could be made thereto without departing from the spirit and scope of the disclosure.

An apparatus for evaluating a deposition process in the manufacture of an organic thin film in accordance with the present disclosure comprises: a chamber in which a process of depositing an organic thin film is performed; a vaporization source, provided inside the chamber, for vaporizing an object compound by heating; and a means for evaluating deposition modality in which the compound vaporized by heating is solidified into a solid phase, followed by analyzing the surficial morphology of the solidified compound.

Accounting for performing the deposition of an organic thin film therein, the chamber segregates from the external environment a space in which a process for depositing an organic thin film is carried out. The chamber may be of an in-line type in which multiple chambers are connected in sequence to each other according to deposition processes that are performed on a substrate continuously moving between the chambers; or of a cluster type in which chambers exist independently and a substrate is introduced into one chamber to undergo one process and then introduced into a different chamber to undergo a next process. In the present disclosure, the chamber may be applied to both the two types.

In order to facilitate the evaporation or sublimation of a material to be deposited, the chamber for use in the organic thin film-depositing process is particularly set to have a pressure lower than atmospheric pressure. A deposition process may be carried out more particularly at a high vacuum of $10^{-4}$ Torr or lower and much more particularly at a high vacuum of $10^{-6}$ Torr or lower.

To this end, the apparatus for evaluating a deposition process in accordance with the present disclosure may comprise a pump for pumping air out of the chamber and may further comprise an exhaust pipe and a valve between the chamber and the pump to maintain a vacuum.

In addition, the apparatus for evaluating a deposition process in accordance with the present disclosure may comprise a vaporization source, provided inside the chamber, for vaporizing the compound to be deposited by heating.

So long as it is adapted to store a compound to be deposited, selected from among organic compounds, organic metal compounds and a combination thereof, and to vaporize the compound to be deposited by heating, any vaporization source may be employed without limitations to the kinds thereof.

Here, the compound to be deposited may be in a form of solid or liquid at room temperature and under a deposition condition. Selection is made of suitable temperature and pressure conditions to set an optimal deposition condition.

The vaporization source in the present disclosure may comprise a reservoir containing therein the compound to be deposited; and a heating part for vaporizing the compound to be deposited by heating.

Here, the reservoir functions to store therein the compound to be deposited and may be in a form of a crucible or a boat made of a metallic or ceramic material durable to the heating by the heating part.

Meanwhile, the heating part may be adapted to surround the reservoir or to exist below or inside the reservoir so as to easily heat the compound to be deposited. For instance, a heater provided with a filament may be used.

The present disclosure comprises a means for evaluating deposition modality which can analyze a surficial morphology of a compound to be deposited after solidification from a vapor state thereof established by heating.

An explanation is given of the means used in the present disclosure for evaluating deposition modality. The means is provided above the vaporization source and corresponds to a constitutional element in which a surficial morphology of a compound to be deposited is analyzed after the compound is solidified from a vapor state thereof established by heating.

By analyzing a morphology of a compound to be deposited after solidification on the means for evaluating deposition modality from a vapor state thereof established by heating, the present disclosure can predict for mass production by use of a chamber employing a deposition-preventing plate the plausibility that a thin film layer of the compound deposited on the deposition-preventing plate may be delaminated or descaled with the running of many rounds of deposition.

In one embodiment of the present disclosure, the means for evaluating deposition modality may be made of a metal, a polymer, ceramic, or a material containing a combination thereof, and particularly of a metal-containing material.

The metallic material may be a metal selected from the group consisting of iron, stainless steel, copper, aluminum, and a combination thereof.

For the sake of protecting the means for evaluating deposition modality or of improving the durability of the means against deposition or for the convenience of washing the means after deposition, a coat may be provided on the means in the present disclosure.

The means for evaluating deposition modality in accordance with the present disclosure may comprise a first and a second region. In greater detail, the first and the second region account for respective different zones in the means for evaluating deposition modality, with spatial separation therebetween, and are provided as respective sites on at least a part of which the compound to be deposited is solidified from a vapor state thereof established by heating.

Here, the first and the second region may be applied without limitations to materials, structures or configurations if they have respective surfaces on which the vaporized compound to be deposited is solidified while being distant from each other enough to afford a spatial separation therebetween.

In addition, when the first and the second region are segregated from each other, the spatial distance therebetween may be either constant along the regions or different from one point to another on the regions.

For instance, the first and the second region may each be a part of the mesh structure formed of wires or a part of the structure established by forming openings in the plate.

Figure 1B:
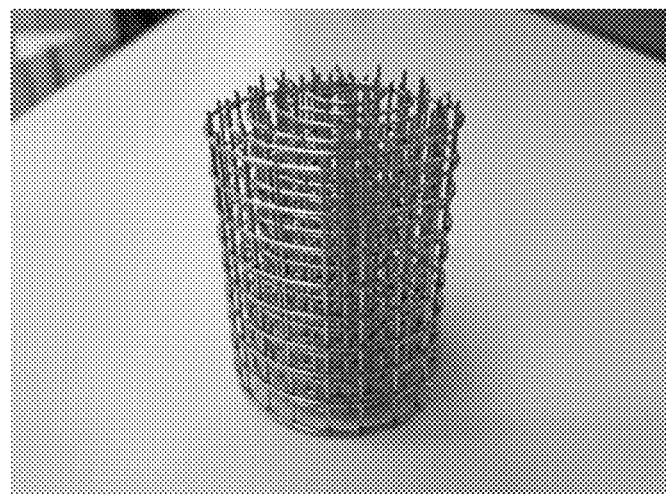

FIG. 1a and FIG. 1b show photographic images, taken from a top view point (FIG. 1a) and a side view point (FIG. 1b), of a means for evaluating deposition modality, which has a mesh structure in accordance with one embodiment of the prevent disclosure.

As shown in FIG. 1a and FIG. 1b, the means for evaluating deposition modality in accordance with the present disclosure is a mesh structure formed of metal wires and has a cylindrical morphology established by rolling up a rectangular mesh structure of wires, with a spatial separation present between wires concentrically circular in the horizontal direction as wound into rolls and between wires linear in the vertical direction.

In the mesh structure, a wire is wound in a roll shape in the horizontal direction so that a part thereof is distant from a different part thereof with a spatial separation therebetween and a wire in the vertical direction is distant from a neighboring vertical wire with a spatial separation therebetween.

In the means for evaluating deposition modality shown in FIG. 1a and FIG. 1b, the wires have their own surfaces on which a compound to be deposited can be solidified from a vapor state thereof established by heating and the solidified morphologies on the respective surfaces are analyzed, whereby it is possible to predict for mass production by use of a chamber employing a deposition-preventing plate the plausibility that a thin film layer of the compound deposited on the deposition-preventing plate may be delaminated or descaled with the running of many rounds of deposition.

According to the present disclosure, further, the means for evaluating deposition modality may have a structure in which when the first region is extended, the first region may or may not be connected to the second region. In the latter case, the first and the second region may be connected to and supported by respective supports.

Meanwhile, as stated above, the means for evaluating deposition modality may comprise a mesh structure or a structure established by forming an opening in the plate, in which a first and a second region are included, with a spatial separation between cross sections thereof.

FIG. 2a to FIG. 2e are schematic views illustrating at least parts of the means for evaluating deposition modality, which includes a first and a second region.

As shown in FIG. 2a to FIG. 2e, a cross section of the means for evaluating deposition modality in FIG. 2a depicts circular wires supported by linear wires, the circular wires forming respective concentric circles different in diameter, and indicates illustrative a first and a second region. Here, the first and the second region are illustrative and may be, as mentioned above, set forth at any position provided that they have respective surfaces on which a vaporized compound to be deposited is solidified and are distant from each other with a spatial separation therebetween.

A cross section of the means for evaluating deposition modality in FIG. 2b depicts a plate having rectangular openings formed in partial regions thereof, in which a first and a second region are spatially separated from each other by the openings.

The cross section of the means for evaluating deposition modality in FIG. 2c depicts a mesh structure of wires in a grid pattern. In FIG. 2d, the cross section of the means for evaluating deposition modality shows a zigzag form in which a wire is extended to connect a first to a second region, with a spatial separation therebetween. The cross section of the means for evaluating deposition modality in FIG. 2e shows a roll shape into which a wire is wound to connect a first to a second region.

Meanwhile, the means for evaluating deposition modality the cross section of which is shown in FIG. 2a to FIG. 2e, may have a vertical structure in which the same multiple cross section structures overlap with each other with a connection therebetween. Further, as shown in FIG. 1a and FIG. 1b, the vertical structure may include a mesh structure of wires or a plate having openings therein, both of which can support the horizontal cross section structures, with a spatial separation between the wires or between the openings.

In the present disclosure, the first region and the second region may be separated from each other a distance of 1 to 10 mm. Affecting the morphology of the deposit which is formed as the vaporized compound to be deposited has been solidified on the means for evaluating deposition modality, the distance between the first and the second region may be changed according to conditions of deposition or kinds of compounds.

Meanwhile, the means for evaluating deposition modality is provided above the vaporization source to allow the vaporized compound to be deposited to be solidified thereon from the vaporization source.

Figure 3A:
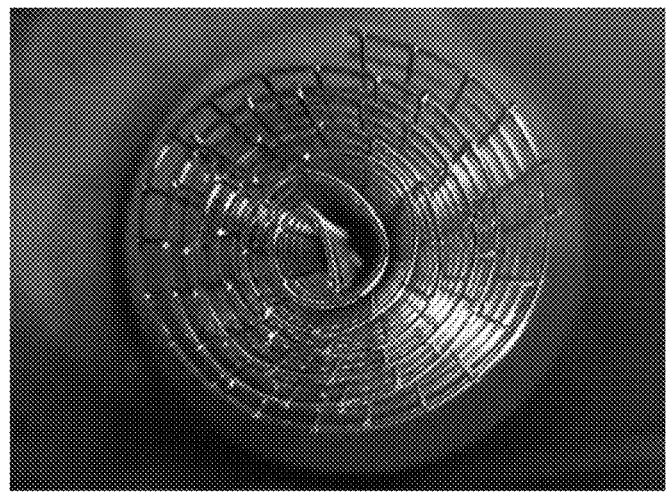
FIG. 3a and FIG. 3b are photographic images, taken from a top view (FIG. 3a) and a side view (FIG. 3b), showing a means for evaluating deposition modality, which has a mash structure coupled with a vaporization source in accordance with one embodiment of the present disclosure.
Figure 3B:
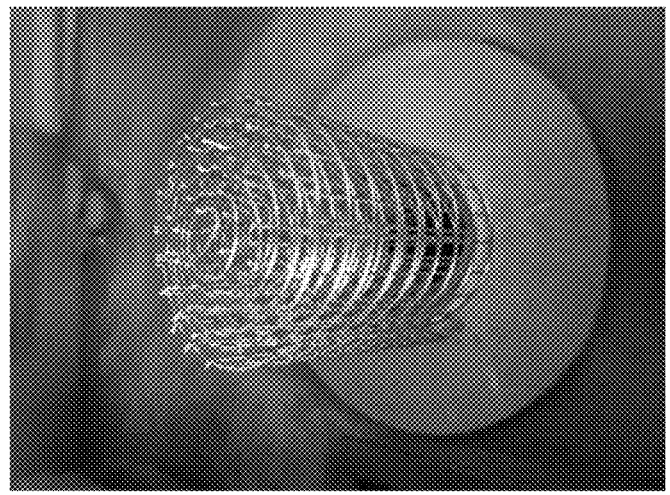

FIG. 3a and FIG. 3b shows photographic images, taken from a top view (FIG. 3a) and a side view (FIG. 3b), of a means for evaluating deposition modality which has a mash structure coupled with a vaporization source in accordance with one embodiment of the present disclosure.

As can be seen in FIG. 3a and FIG. 3b, a crucible is used as the reservoir of the vaporization source and the vaporization source may further comprise a heater (not shown) to heat the crucible. So long as it allows for the even evaporation of the compound to be deposited by the heating part, any shape may be suitably selected for the crucible without limitations.

Because the crucible is heated by a heating part that can heat to high temperatures by use of an external power supply, the crucible is particularly made of a material that should not be deformed at such high temperatures, can facilitate heat transmittance to the compound to be deposited, and can be readily washed after a thermal vacuum deposition process. A crucible made of a ceramic or metallic material may be used.

After the compound to be deposited which is in a solid or liquid state is vaporized from the reservoir, such as a crucible which is heated by the heating part, the compound may be solidified on a part of the surface of the means, positioned above the reservoir, for evaluating deposition modality. In this regard, it is possible to determine whether a thick layer of the compound to be deposited is formed on the deposition-preventing plate for predetermined period of evaporation by analyzing the morphology in which the compound to be deposition is solidified on the means for evaluating deposition modality.

That is, the present disclosure provides a method for evaluating a deposition process to determine whether or not the deposition of a compound to be deposited into an organic thin film can be performed, in which the compound to be deposited is introduced into the vaporization source of the aforementioned apparatus for evaluating a deposition process and solidified on at least part of the surface of the means for evaluating deposition modality by heating, followed by checking the deposition morphology of the compound on the means for evaluating deposition modality.

Below, an explanation is stepwise given of the method. The method for evaluating a deposition process may comprise the steps of: introducing a compound to be deposited into the vaporization source of the aforementioned apparatus for evaluating a deposition process and solidifying the compound on at least part of a surface of the means for evaluating deposition modality by heating; checking the deposition morphology of the compound solidified on the surface of the means for evaluating deposition modality; and determining whether or not to perform an organic thin film deposition process within a chamber containing a substrate to be deposited with the compound and a deposition-preventing plate, depending on surficial morphologies of the solidified compound.

The first step, that is, the step of solidifying a compound to be deposited on at least part of a surface of the means for evaluating deposition modality corresponds to a configuration employed in typical organic deposition processes. The second step of checking the deposition modality of the compound solidified on the surface is to analyze a morphological state of the compound solidified on the surface of the means for evaluating deposition modality from a vapor state established by the heating part, as implemented by observing with the naked eye or on a monitor conjugated with a device such as a CCD (charge coupled device).

The last step of determining whether or not to perform an organic thin film deposition process is to make a decision on continuing to run the process depending on the degree of blockage of a space between the first and the second region of the means for evaluating deposition modality as the compound to be deposited is solidified on the first and the second region. Characteristics of the degree of blockage may vary depending on conditions for deposition processes and intrinsic properties of compounds to be deposited. Thus, the examination of these characteristics prior to the start of a mass production process in a chamber containing a deposition-preventing plate may lead to the section of a compound to be deposited or a process condition that is highly unlikely to form a thick thin film layer on the deposition-preventing plate during the mass production process for which significant manpower, facilities and costs are required, thus reducing unnecessary time and cost.

FIGS. 4a, 4b, 5a and 5b are photographic images of results of the method for evaluating a deposition process to determine whether or not to perform the manufacture of an organic thin film from a compound to be deposited, using the apparatus for evaluating a deposition process in accordance with embodiments of the present disclosure.

Figure 4A:
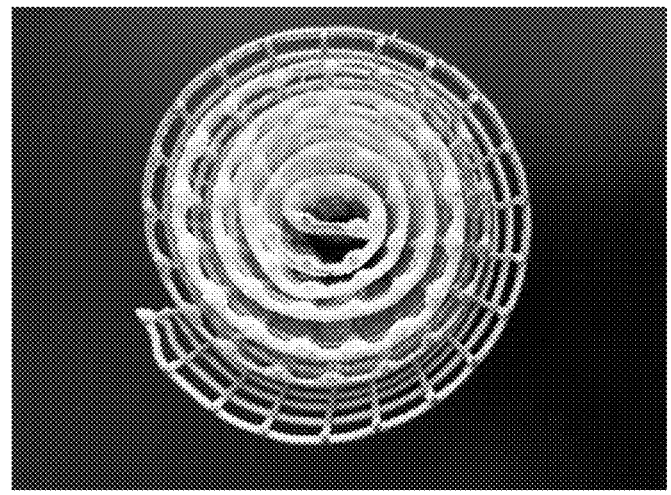
FIG. 4a and FIG. 4b are images, taken from a top view (FIG. 4a) and a right-top view (FIG. 4b), showing a result of the deposition of a compound of interest according to one embodiment of the present disclosure on the means for evaluating a deposition process which has a mesh structure.
Figure 4B:
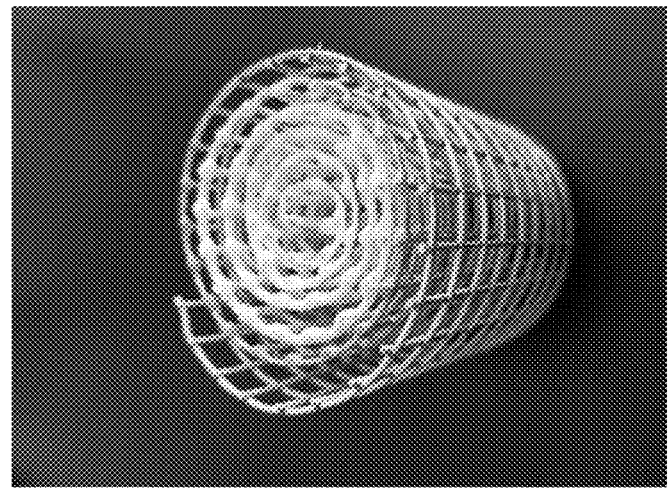

In greater detail, FIG. 4a and FIG. 4b are images, taken from a top view (FIG. 4a) and a right-top view (FIG. 4b), showing a result of the deposition of a compound of interest according to one embodiment of the present disclosure on the means for evaluating a deposition process which has a mesh structure.

When a deposition condition and a compound to be deposited according to FIG. 4a and FIG. 4b are used, the deposits solidified on the means for evaluating deposition modality are observed to be neither entangled with each other nor clog spaces in the mesh structure. This result indicates that although a deposition process is practically performed with the same compound for a long period of time in the mass production process under the condition, a thick thin-film layer may be highly unlikely to be formed on the deposition-preventing plate, giving the expectation of the possibility that all or part of the thin film layer formed on the deposition-preventing plate would be not delaminated or descaled.

Figure 5A:
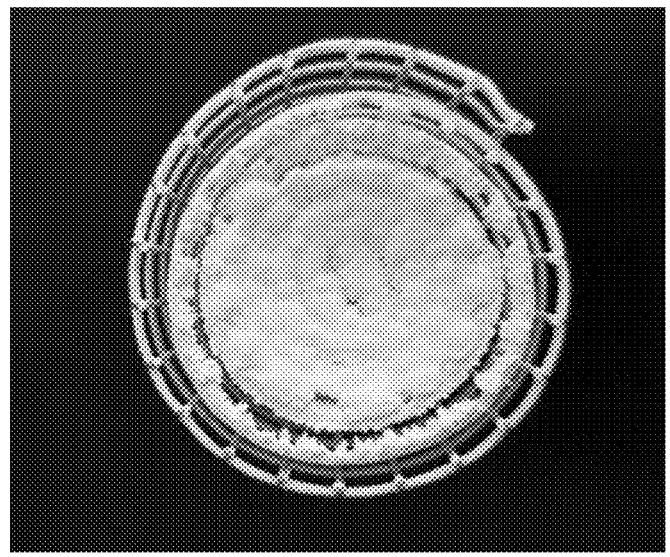
FIG. 5a and FIG. 5b are photographic images, taken from a top view (FIG. 5a) and a right-top view (FIG. 5b), showing a result of the deposition of a compound of interest, different from that used in FIG. 4a and FIG. 4b, according to another embodiment of the present disclosure, on the means for evaluating a deposition process which has a mesh structure.
Figure 5B:
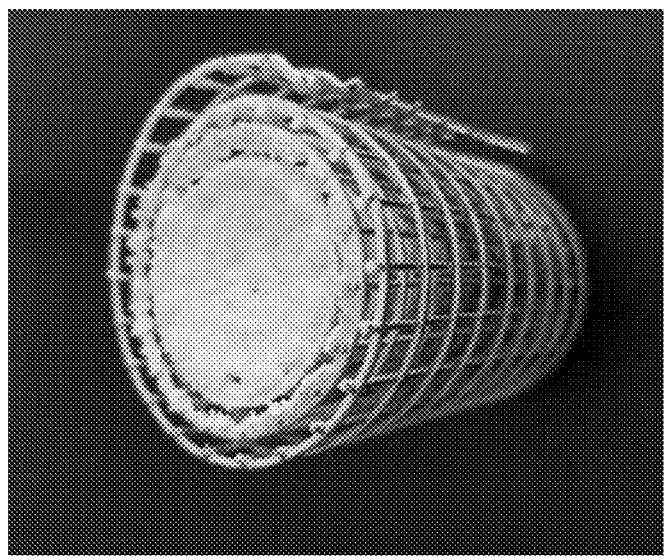

FIG. 5a and FIG. 5b are images, taken from a top view (FIG. 5a) and a right-top view (FIG. 5b), showing a result of the deposition of a compound of interest, different from that used in FIG. 4a and FIG. 4b, according to another embodiment of the present disclosure on the means for evaluating a deposition process which has a mesh structure.

In greater detail, when a deposition condition and a compound to be deposited according to FIG. 5a and FIG. 5b are used, the deposits solidified on the means for evaluating deposition modality is observed to be entangled with each other or to clog spaces in the mesh structure. This result indicates that when a deposition process is practically performed with the same compound for a long period of time in the mass production process under the condition, a thick thin-film layer may be highly likely to be formed on the deposition-preventing plate, giving the expectation of the possibility that all or part of the thin film layer formed on the deposition-preventing plate would be delaminated or descaled.

For the case of FIG. 5a and FIG. 5b, in contrast to that of FIG. 4a and FIG. 4b, the analysis of the phenomenon that deposits solidified on the means for evaluating deposition modality are entangled with each other or clog spaces in the mesh structure allows for the expectation of the possibility that when a mass production process using a deposition-preventing plate is run, a thick thin-film layer will be formed, like that of FIG. 5a and FIG. 5b, on the deposition-preventing plate. Hence, when the deposition modality is similar to the pattern shown in FIG. 5a and FIG. 5b, the mass production process may not employ the deposition condition or compound used in the case of FIG. 5a and FIG. 5b, thus reducing unnecessary time and cost.

Capable of evaluating the modality of a deposit on a deposition-preventing plate within a chamber for use in a deposition process by examining in advance or predicting whether a thin film layer is formed thickly on the deposition-preventing plate during many rounds of deposition, as described hitherto, the apparatus for evaluating a deposition process according to the present disclosure enjoys the advantage of preventing all or part of the formed thin film layer from being delaminated or descaled.

In addition, the apparatus for evaluation of a deposition process can be used to predict the modality of deposits on a deposition-preventing plate prior to a mass production process for the manufacture of an organic thin film, thereby selecting organic materials deposited into a thin film that is highly unlikely to be delaminated or descaled during many rounds of deposition. Therefore, the present disclosure has the effect of reducing temporal and economical costs that may additionally incurred.

As the present disclosure may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An apparatus for evaluating a deposition process in manufacture of an organic thin film, comprising:
   a chamber in which a process of depositing an organic thin film is performed;
   a vaporization source provided inside the chamber, for vaporizing a compound to be deposited by heating; and
   a deposition modality evaluating mesh or plate provided inside the chamber, wherein the compound vaporized by heating is solidified into a solid phase in the deposition modality evaluating mesh or plate,
   wherein the deposition modality evaluating mesh or plate comprises:
   a first region, wherein the compound vaporized is solidified on a part of the surface of the first region in a solid phase from a vapor state; and
   a second region spatially separated from the first region, wherein the compound vaporized is solidified on a part of the surface of the second region in a solid phase from a vapor state, and
   the deposition modality evaluating mesh or plate is located at a place where the solidified compounds on the first region and the second region are visually observable during the deposition or after solidifying the compound by a naked eye or CCD from outside the chamber, wherein the deposition modality evaluating mesh is a mesh having circular wires supported by linear wires, wherein the circular wires form respective concentric circles different in diameter, and the deposition modality evaluating plate is a plate having rectangular openings formed in partial regions thereof.

2. The apparatus of claim 1, wherein the vaporization source comprises:

a reservoir containing the compound to be deposited; and a heating part for heating the reservoir to vaporize the compound to be deposited.

3. The apparatus of claim 2, wherein the reservoir is in a form of a crucible or a boat.

4. The apparatus of claim 1, wherein the chamber has an internal pressure lower than atmospheric pressure therein.

5. The apparatus of claim 1, wherein the deposition modality evaluating mesh or plate is made of a material containing a metal, ceramic, or a combination thereof.

6. The apparatus of claim 1, wherein the first region and the second region are each a part of a mesh structure made of wires or a part of a plate structure in which openings are formed.

7. The apparatus of claim 1, wherein the entirety of the first region does not directly contact the entirety of the second region, and the first region and the second region are each supported by respective supports and connected through the respective supports.

8. The apparatus of claim 1, wherein the first region and the second region are at least partially spaced apart by 1 to 10 mm.

* * * * *